(12) United States Patent
Volk et al.

(10) Patent No.: US 6,693,450 B1
(45) Date of Patent: Feb. 17, 2004

(54) DYNAMIC SWING VOLTAGE ADJUSTMENT

(75) Inventors: Andrew M. Volk, Granite Bay, CA (US); Warren R. Morrow, Steilacoom, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/677,117

(22) Filed: Sep. 29, 2000

(51) Int. Cl.[7] .............................................. H03K 17/16
(52) U.S. Cl. .............................. 326/30; 326/32; 326/33; 326/34; 326/87
(58) Field of Search ............................... 326/31–34, 82, 326/83, 87, 91

(56) References Cited

U.S. PATENT DOCUMENTS

| | | | |
|---|---|---|---|
| 5,134,311 A | * | 7/1992 | Biber et al. .................. 307/270 |
| 5,596,285 A | | 1/1997 | Marbot et al. |
| 5,677,639 A | | 10/1997 | Masiewicz |
| 6,060,907 A | * | 5/2000 | Vishwanthaiah et al. ...... 326/87 |
| 6,118,310 A | * | 9/2000 | Esch, Jr. ..................... 327/108 |
| 6,177,809 B1 | * | 1/2001 | Tonti et al. .................... 326/83 |

FOREIGN PATENT DOCUMENTS

| | | |
|---|---|---|
| EP | 0 463 316 | 1/1992 |
| JP | 11145814 | 5/1999 |

OTHER PUBLICATIONS

DeHon et al., *IEEE International Solid–State Circuits Conference*, 1993, "Automatic Impedance Control," pp. 164–165,.

Gabara et al., *IEEE Journal of Solid State Circuits*, 1992, 27(8):1176–1185.

Knight et al., *IEEE Journal of Solid–State Circuits*; 1988, 23(2):457–464.

Kushiyama et al., IEEE Journal of Solid–State Circuits, 1993, 28(4):490–498.

Pilo et al., *IEEE International Solid–State Circuits Conference*, 1996, pp. 148–149.

Takahashi et al., *IEEE International Solid–State Circuits Conference*, 1995, "A CMOS Gate Array with 600Mb/s Simultaneous Bidirectional I/O Circuits," pp. 40–41.

Trotter, et al., *IEEE*, 1994, "A CMOS Low Voltage High Performance Interface", pp. 44–48.

* cited by examiner

*Primary Examiner*—Anh Tran
(74) *Attorney, Agent, or Firm*—Fish & Richardson P.C.

(57) ABSTRACT

The disclosure presents a device comprising a driver configured to transmit a signal on a bus line, including a driver element configured to pull against termination impedance. The impedance of the driver element is dynamically adjustable. The disclosure also presents a method of electronically adjusting the impedance of the driver element to regulate the swing voltage on the bus line.

16 Claims, 5 Drawing Sheets

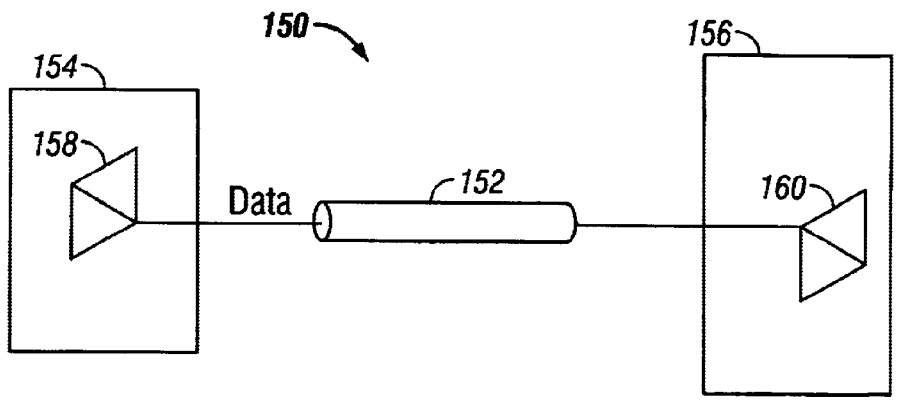
FIG. 6
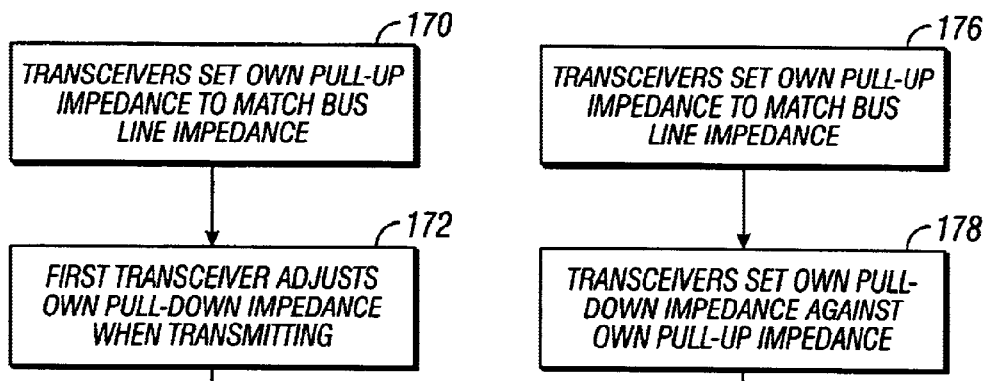
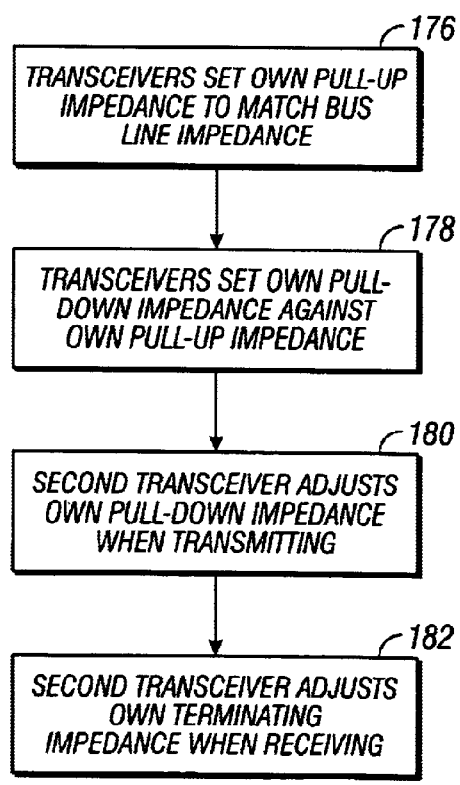

DYNAMIC SWING VOLTAGE ADJUSTMENT

BACKGROUND

This invention relates to dynamic output impedance adjustment.

A driver is a digital electronic circuit for holding a binary value, and communicating it to other circuits to which it is connected. The binary value is represented by a voltage level. It is common to connect a driver to a data bus for communicating the binary value to a receiving circuit by "driving" the bus to a desired voltage level. In a typical parallel interface, one of the voltage levels (HIGH or LOW) is a power rail voltage, and the other voltage signal is a "swing voltage" away from the power rail voltage. That is, the difference between a voltage HIGH signal on bus line and a voltage LOW signal is called the "signal swing."

The driver has an inherent output impedance. The driver's output impedance when driving the bus to a voltage HIGH level may differ from the driver's output impedance when driving the bus to a voltage LOW level. In addition, the bus has an inherent transmission line or characteristic impedance, and the receiving end of a parallel-terminated system has an input impedance, called the termination impedance. To obtain a high rate of data transfer on the bus, the characteristic impedance should closely match the termination impedance.

DESCRIPTION OF DRAWINGS

FIG. 6 is a diagram of a two-transceiver system.

FIG. 7 is a flowchart illustrating dynamic impedance adjustment in a two-transceiver system.

FIG. 8 is a flowchart illustrating dynamic impedance adjustment in a two-transceiver system.

DETAILED DESCRIPTION

Figure 1A:
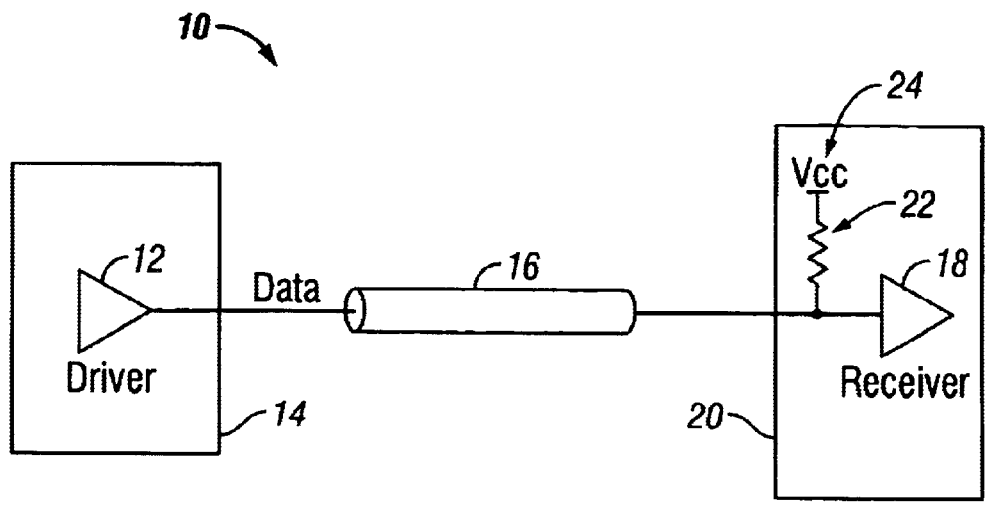
FIGS. 1a and 1b are diagrams of transmitter-receiver systems with parallel terminations.
Figure 1B:
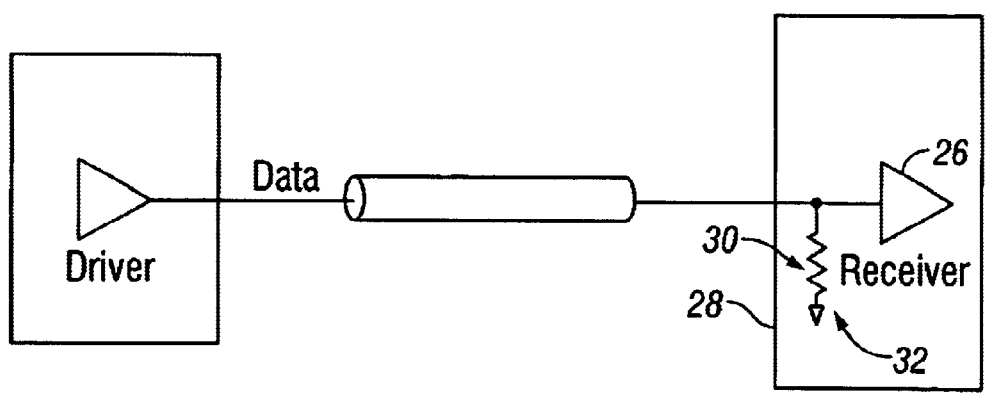

FIG. 1a and 1b are diagrams showing typical parallel interfaces. In parallel interface 10 shown in FIG. 1a, a driver 12 in a sending circuit 14 transmits data along a bus line 16 to a receiver 18 in a receiving circuit 20. Driver 12 drives the voltage on bus line 16 to a desired value. The dynamic voltage on bus line 16 depends upon the ratio of the output impedance of driver 12 to transmission line impedance, times the pull-up voltage 24 of receiving circuit 20.

In FIG. 1a, receiver 18 uses a pull-up resistor 22 connected to the positive voltage supply Vcc 24, thus terminating to Vcc. A receiver may also terminate to the opposite power rail, such as ground, as shown in FIG. 1b. In FIG. 1b, a receiver 26 uses a pull-down resistor 30 connected to circuit ground 32. Pull-up and pull-down resistors 22 and 30 represent pull-up and pull-down termination impedances, arid need not be actual resistors.

Driver 12, looking down bus line 16, sees impedance due to the characteristic impedance of bus line 16 and due to the termination impedance, i.e., the pull-up or pull-down impedance. The input impedance of the receiver is typically very high, and because the pull-up or pull-down impedance is in parallel with the receiver, the receiver's high impedance is not seen by the driver.

The characteristic impedance and the termination impedance affect the signal transmitted on bus line 16. Ideally, the characteristic impedance and the termination impedance should be matched as closely as possible to minimize signal reflection. If signal reflections are minimized, the swing voltage can be safely regulated by dynamically adjusting the output impedance of the driver.

Figure 2:
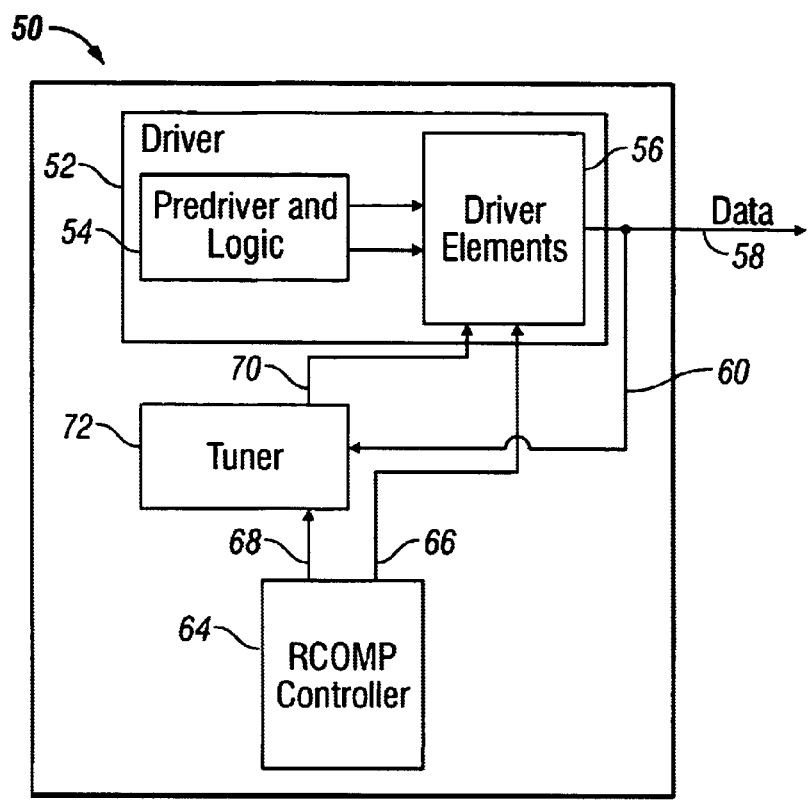
FIG. 2 is a block diagram of a driver system.

FIG. 2 shows a driver system 50, in which driver 52 includes a predriver and logic 54 and driver elements 56. Predriver 54 supplies a binary value to driver elements 56. Driver elements 56 drive the voltage on a bus line 58 to a desired voltage. As will be described below, the impedance of driver elements 56 is programmable and dynamically adjustable. The impedance of driver elements 56 is regulated by programming signals 66 from a resistance compensation controller 64, called the "RCOMP Controller," and by tuning signals 70 from a tuner 72. Tuner 72 senses a voltage feedback signal 60 from the bus line 58 to adjust the impedance and thus regulate the swing voltage.

Figure 3:
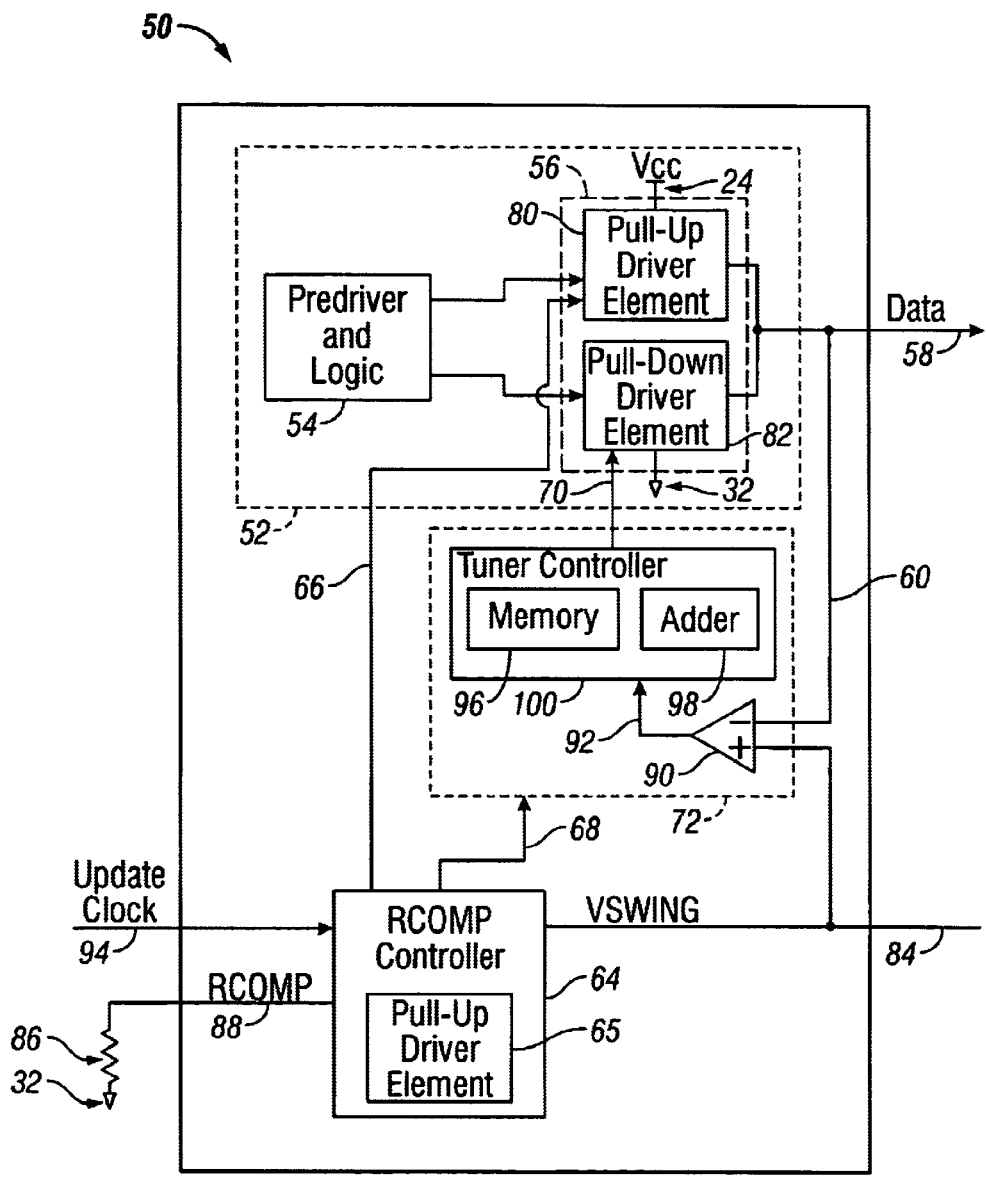
FIG. 3 is a block diagram of a driver system.

FIG. 3 shows driver system 50 configured to transmit data on bus line 58 to a receiver with pull-up impedance, such as receiver 18 shown in FIG. 1a. Driver system 50 can be configured to transmit to a receiver with pull-down impedance as well, but for simplicity, transmission to a receiver with pull-up impedance will be described.

Driver elements 56 comprise a pull-up driver element 80 and a pull-down driver element 82. The impedance of pull-up driver element 80 and the impedance of pull-down driver element 82 are programmable. Because receiver 18 has pull-up impedance 22, pull-down driver element 82 pulls against the termination, and therefore dynamic adjustment to the impedance of pull-down driver element 82 will be described.

To facilitate the dynamic adjustment of the output impedance of driver system 50, the impedance of pull-up driver element 80 and the impedance of pull-down driver element 82 are electronically adjustable. More specifically, the impedance of pull-up driver element 80 is controlled by a pull-up control signal 66 and the impedance of pull-down driver element 82 is controlled by a pull-down control signal 70. The impedance of each driver element 80 and 82 is regulated by RCOMP controller 64. In addition, the impedance of pull-down driver element 82 is dynamically adjusted by tuner 72. Pull-up control signal 66 and pull-down control signal 70 are digital signals and may be conveyed on a plurality of data lines, each line carrying a single control bit. Signals 68 from RCOMP controller to tuner 66 likewise are digital signals and may be conveyed on a plurality of data lines.

For purposes of illustration, it is assumed that a voltage HIGH signal on bus line 58 is at or near supply voltage Vcc 24, and that a voltage LOW signal is ideally a certain swing voltage below the supply voltage. In FIG. 3, the ideal voltage LOW level is one-third of supply voltage Vcc 24, and is denoted "VSWING." Driver system 50 is coupled to a regulated reference voltage 84 set to the magnitude VSWING, i.e., one-third of the supply voltage. It is further assumed that the relationship between the voltage on bus line 58 and the output impedance of driver 52 is known. When the termination impedance is closely matched to the characteristic impedance, the relationship is based upon voltage division.

When bus line 58 is driven LOW by pull-down driver element 82, the resulting voltage on bus line 58 should be close to the value of VSWING 84. The actual voltage on bus line 58, however, may be above or below VSWING 84.

RCOMP controller 64 programs the impedance of pull-down driving element 82. A resistor 86 connects RCOMP controller 64 to circuit ground 32, which in this example is the power rail opposite of that used by receiver 18. A voltage divider is formed by resistor 86 and a copy 65 of pull-up driving element 80 in RCOMP controller 64 coupled to RCOMP line 88. The voltage divider produces an RCOMP input voltage 88 that is equal to VSWING voltage 84 when the impedance of the pull-up driving element 65 is at a desired value. The target impedance of the pull-down driving element 82 is set in a similar manner, using a copy (not shown) of driving element 82 and another voltage divider (not shown) in RCOMP controller 64.

RCOMP controller 64 initially sets pull-down driving element 82 impedance close to a value expected to produce a voltage LOW signal equal to VSWING 84. RCOMP further updates the impedance settings periodically when triggered by an update clock input 94. Traffic on bus line 58 may be suspended during RCOMP updates. In the course of actual transmissions, however, the terminating impedance may be different from the expected value, or the terminal impedance may change due to loading at the receiver, heating or other factors. As the impedance seen by driver 52 changes, the swing voltage changes as well, and the voltage LOW signal does not remain equal to VSWING 84. To compensate for shifts in the swing voltage, the impedance of pull-down driving element 82 is dynamically adjusted.

Dynamic compensation is accomplished by feeding back the voltage 60 transmitted on bus line 58 to tuner 72. Tuner 72 includes a comparator 90, which receives the feedback voltage 60 as one input and the regulated VSWING voltage 84 as another input. Comparator 90 compares the two input voltages 60 and 84 and determines which of the two is higher, and produces an error signal 92. The polarity of comparator 90 shown in FIG. 3 is arbitrary, but for illustrative purposes VSWING voltage 84 is applied to the noninverting input. Consequently, when the voltage 60 transmitted on bus line 58 is the higher of the two voltages, comparator 90 generates a voltage LOW error signal, and when the regulated VSWING voltage 84 is higher, comparator 90 generates a voltage HIGH error signal 92.

A tuner controller 100 receives error signal 92. Tuner controller 100 compensates for the error by electronically increasing or decreasing the impedance of pull-down driver element 82. Tuner controller 100 includes an adder 98 to digitally increase or decrease digital pull-down control signal 70, thereby increasing or decreasing the impedance of pull-down driver element 82. Tuner controller 100 can make adjustments in large or small increments with adder 98. To improve driver system 50 stability, tuner controller 100 generally does not let increments exceed a certain amount, and does allow some degree of impedance mismatch with each adjustment. By repeatedly increasing or decreasing the impedance, tuner 72 "homes in" on the impedance of pull-down driver element 82 that produces a voltage LOW signal as close to VSWING 84 as possible. The adjustment to the impedance is performed dynamically, i.e., while driver 52 is performing data transmission.

Tuner controller 100 includes memory 96 to store data about impedance characteristics of bus line 58. Tuner controller 100 may further be configured to ignore voltage HIGH signals transmitted on bus line 58, because such signals are not pertinent to impedance adjustment of pull-down driver element 82. Tuner controller 100 may also be programmed with search strategies for finding the best impedance of pull-down driver element 82. For example, tuner controller 100 may be programmed to make substantial adjustments at first, followed by smaller adjustments as tuner 72 homes in on the best voltage level. Tuner controller 100 may also be programmed to recognize cases in which matching voltage LOW and VSWING 84 is not possible.

Figure 4:
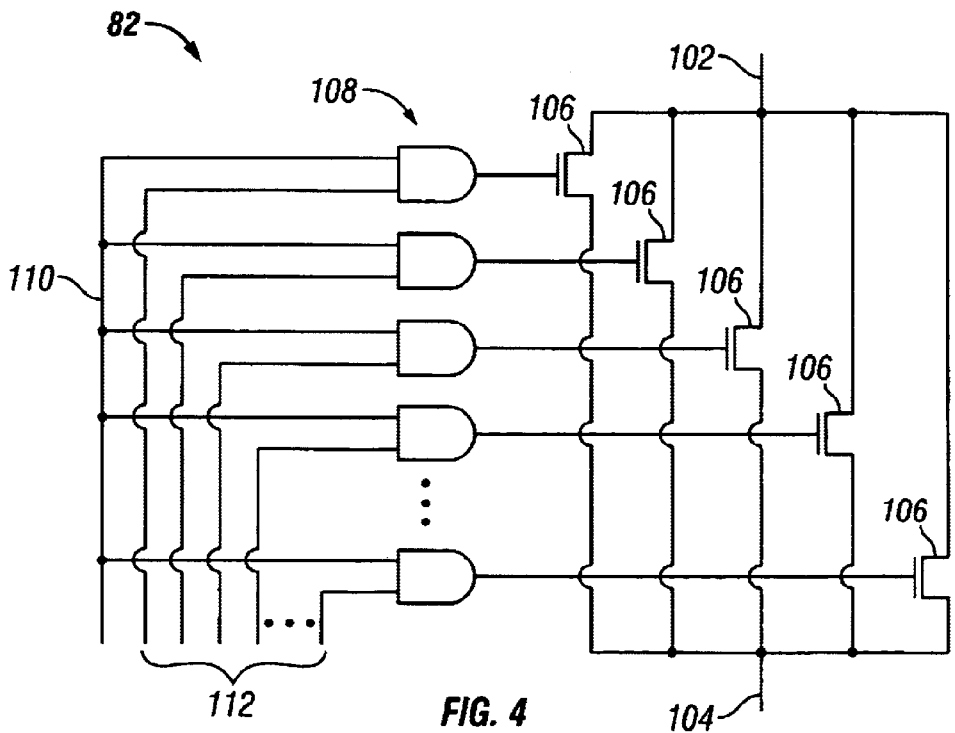
FIG. 4 is a circuit diagram of a pull-down driver element.

FIG. 4 is a diagram of an exemplary programmable pull-down driver element 82. A set of n-channel metal oxide semiconductor field-effect transistors (MOSFETs) 106 are arrayed in parallel between terminals 102 and 104. Terminal 102 is connected to output bus line 58, and terminal 104 is connected to circuit ground 32. The number and values of MOSFETs 106 that are turned on when pull-down driver element 100 is enabled determines the impedance between terminals 102 and 104. In a preferred embodiment, MOSFETs 106 are sized in a binary progression to allow a wide range of impedance programming (e.g., between 25 and 100 ohms) and with a sufficient number to get a sufficiently small granularity (e.g., about 1.5 ohms). MOSFETs 106 may be sized in other ways as well, such as logarithmically or linearly.

The gate of each MOSFET 106 is driven by the output of one of a set of corresponding AND gates 108. One input of each AND gate 108 is coupled to one line of a multi-bit control line 112, which corresponds to pull-down control signal 70. Each control line 112 enables its corresponding MOSFET when HIGH and disables its corresponding MOSFET when LOW. The other input to each AND gate 108 is a single bit data line 110, which carries the data to be transmitted on bus line 58. The data conveyed on single bit data line 110 are supplied by predriver 54. It is assumed that a HIGH voltage asserted on single bit data line 110 corresponds to driving output bus line 58 to its LOW voltage.

If a MOSFET's 106 control line 112 is LOW, MOSFET 106 is turned off. If a particular MOSFET's control line 112 is HIGH, the state of that MOSFET depends on single bit data line 110. Thus, the values on control lines 112 determine which MOSFETs 106 are on, and consequently determines the impedance between terminals 102 and 104 when single bit data line 110 is HIGH. In the illustrative case of MOSFETs 106 sized in a binary progression, a binary number is transmitted on control lines 112 with the binary number corresponding to an impedance and each control line 112 corresponding to a bit of the binary number. Adding to or subtracting from the binary number increases or decreases the impedance.

Although the exemplary system described above pulls down and functions with a receiver that pulls up, the structure of a driver system 50 that pulls up against a pull-down receiver is similar. In that case, pull-up driver element 80 may be controlled by tuner controller 72. The structure of programmable pull-up driver element is similar to the structure of programmable pull-down 82 except that the MOSFETs in the programmable pull-up are p-channel devices, the logic gates are OR gates rather than AND gates, and the sense of the control lines is opposite that of programmable pull-up element 80.

Figure 5:
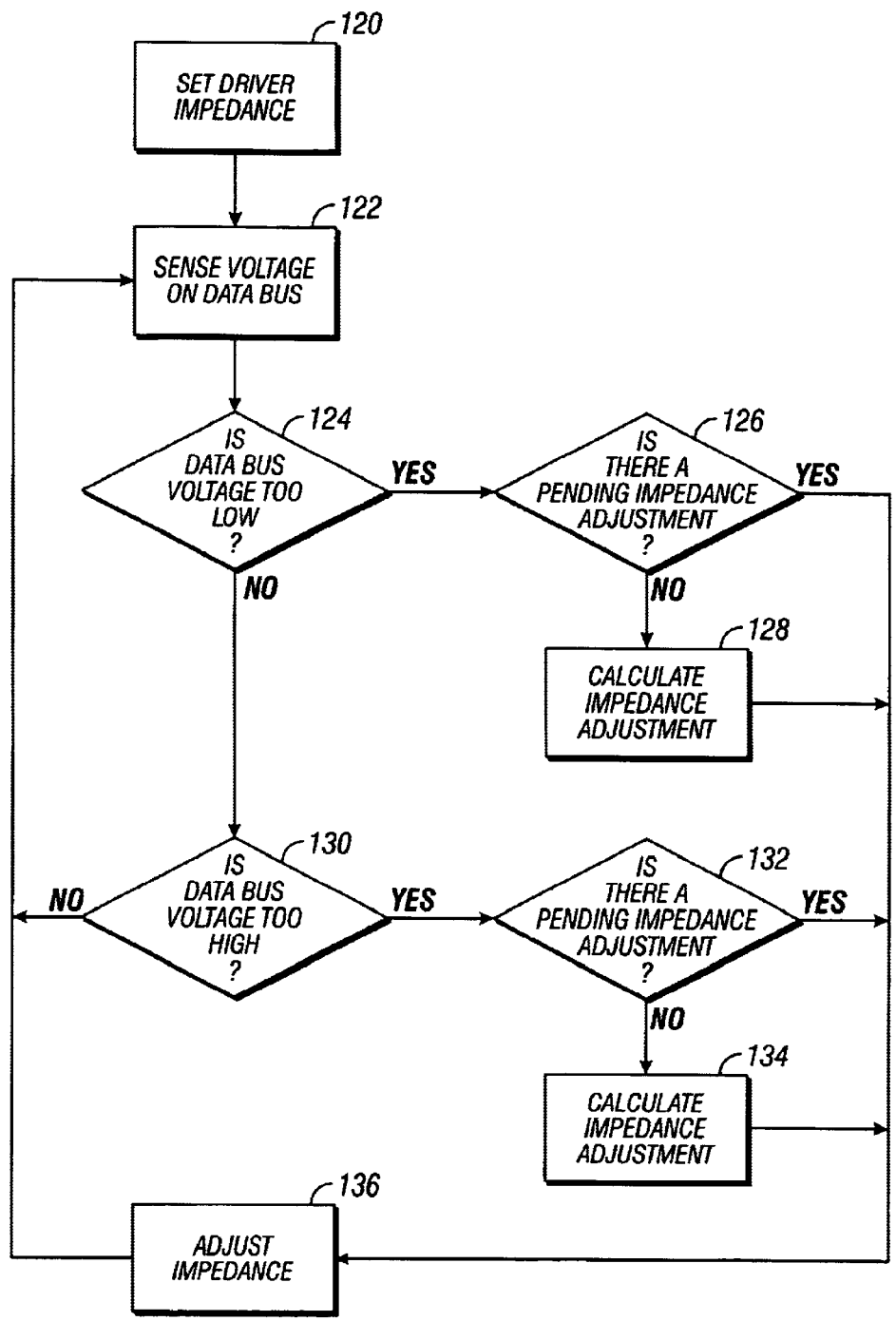
FIG. 5 is a flowchart illustrating dynamic impedance adjustment.

FIG. 5 presents a flowchart illustrating one mode of operation of system 50. The method set out in FIG. 5 is applicable to the case in which the data on bus line 58 are being transmitted by driver 52 to a receiver 18 with pull-up impedance. A flowchart outlining the method applicable to a receiver 26 with pull-down impedance is similar. RCOMP controller 64 sets the impedance of driver 56 to match the expected value of the termination impedance (120). During operation, tuner 72 senses the voltage on bus line 58 (122). When the voltage on bus line 58 is too low, tuner 72 adjusts the impedance of driver 52. As described above, tuner controller 100 can adjust impedance up or down and can make adjustments in large or small increments. Tuner controller 100 may be programmed, for example, to adjust the impedance by a certain amount. For example, when the bus 58 voltage is too low for two consecutive cycles, tuner controller 100 may be programmed to adjust the impedance on the current cycle by the same amount as the previous cycle. Tuner controller 100 may be also be programmed to anticipate impedance adjustments. When tuner controller 100 has a pending pre-calculated adjustment (126), the adjustment can be made (136) without further calculation. Otherwise, tuner controller 100 calculates a new adjustment (128) and makes the adjustment (136). When the voltage on bus line 58 is too high, the process is similar (130, 132, 134). Tuner controller 100 can be programmed to forego adjustment (130) when, for example, feedback signals 60 indicate that the voltage on bus line 58 is close to but slightly exceeding VSWING 84. In other words, tuner controller 100 can be configured to recognize those cases in which a small impedance adjustment would make the bus line 58 voltage too low.

FIG. 6 shows a two-transceiver system 150. Circuits 154 and 156, which share a bus line 152, include transceivers 158 and 160, respectively. Both transceivers 158 and 160 include pull-up and pull-down driver elements and termination elements, each driver and termination element having an adjustable impedance. While receiving, the pull-up or pull-down driver element may be used to form the termination element, or alternatively the termination element may be an element separate from the driver elements. For simplicity, it will be assumed system 150 uses a protocol in which a voltage HIGH signal is at or near supply voltage Vcc 24 and a voltage LOW signal is a swing voltage below Vcc 24. With this assumption, the pull-up driver element may be used as the termination impedance while receiving.

FIG. 7 is a flowchart showing how transceivers 158 and 160 regulate the swing voltage on bus line 152. Prior to transmission, the RCOMP controller of each transceiver 158, 160 adjusts the transceiver's pull-up impedance to match the characteristic impedance of bus line 152 (170). During communication between transceivers 158 and 160, one transceiver will be transmitting and the other will be receiving. One transceiver at a time, transceiver 158 for example, controls the voltage on bus line 152. While transmitting, transceiver 158 dynamically adjusts its pull-down impedance to regulate the swing voltage on bus line 152 (172). When transceiver 160 transmits and transceiver 158 receives, transceiver 160 dynamically adjusts its pull-down impedance to regulate the swing voltage on bus line 152 (174). Both transceivers dynamically adjust driver impedance to regulate the voltage on bus line 152.

An alternative technique for regulating the swing voltage on bus line 152 is shown in FIG. 8. The RCOMP controller of the transceivers sets the transceivers' pull-up impedance to match the impedance on bus line 152 (176). The transceivers then sets their own pull-down impedance against their own pull-up impedance, adjusting the pull-down impedance until the proper VSWING voltage value appears on bus line 152 (178). While one transceiver is transmitting, the tuner of the transmitting transceiver dynamically adjusts its pull-down impedance until the desired VSWING voltage appears on bus line 152 (180). While receiving, the other transceiver then adjusts its termination impedance until the proper VSWING voltage value appears on bus line 152 (182). Generally the termination impedance adjustment is subject to allowable bus line-to-terminator impedance mismatch. In the scenario depicted in FIG. 8, dynamic adjustments in one component based upon impedances in another component are performed by one transceiver.

A number of embodiments of the invention have been described. These and other embodiments are within the scope of the following claims.

What is claimed is:

1. A device comprising a driver having an output impedance, the driver configured to transmit a signal on a bus line, the driver including a pull-up driver circuit and a pull-down driver circuit arranged in a pull-up pull-down configuration, the pull-up and pull-down driver circuits being independently controllable;
    a tuner to compare a voltage level of the signal to a reference voltage and to control at least one of the pull-up and pull-down driver circuits as a function of comparing the signal voltage level to the reference voltage to adjust the driver output impedance so that the signal voltage level is controlled; and
    a controller configured to electronically set the output impedance of the driver to a first value as a function of a characteristic impedance of the bus line.

2. The device of claim 1 wherein the output impedance of the driver is adjustable digitally.

3. The device of claim 1 wherein the tuner comprises memory.

4. The device of claim 1 wherein the tuner comprises a comparator configured to receive the signal and the reference voltage.

5. A method comprising:
    providing a driver configured to communicate a signal on a bus line having a characteristic impedance;
    setting an output impedance of the driver as a function of the bus line characteristic impedance;
    communicating the signal to the bus line;
    while communicating the signal;
    sensing a voltage level of the signal, wherein the voltage level is a function of the output impedance of the driver, the output impedance including a pull-up driver circuit and a pull-down driver circuit;
    generating an error signal as a function of comparing the signal voltage level to a reference voltage; and
    dynamically adjusting one of the pull-up driver circuit and the pull-down driver circuit so that the output impedance of the driver is changed to reduce an amplitude of the error signal.

6. The method of claim 5 further comprising calculating an adjustment to the output impedance of the driver.

7. The method of claim 5, wherein adjusting the output impedance of the driver comprises adjusting the impedance of a driver element.

8. The method of claim 5 further comprising:
    setting a termination impedance of a receiver configured to receive the signal on the bus line; and
    adjusting the output impedance of the receiver.

9. A device comprising:
    a driver configured to transmit a signal on a bus line, the driver having a programmable impedance, the driver including a pull-up driver circuit and a pull-down driver circuit, each of the driver circuits being independently controllable to adjust the programmable impedance;
    a first controller configured to control each of the driver circuits to establish a starting impedance value of the driver;

a feedback circuit configured to compare a voltage level of the signal with a reference voltage, wherein the voltage level is a function of the impedance; and a second controller configured to control one of the pull-up and pull-down driver circuits independent of the other of the pull-up and pull-down driver circuits based upon comparing the voltage level to the reference voltage to adjust dynamically the programmable impedance of the driver.

10. The device of claim 9, wherein the second controller is configured to adjust dynamically the impedance of the driver to move the voltage on the bus line closer to the reference voltage.

11. The device of claim 14, wherein driver comprises:

a signal source;

a plurality of transistors in parallel;

a data line coupling each transistor to the signal source; and a control line coupling to each transistor to the second controller, wherein the state of each transistor is a function of the signals on the data line and the control line.

12. The device of claim 11, wherein the output impedance of the device is a function of the state of the transistors.

13. A method comprising:

setting a termination impedance of a first transceiver configured to receive a signal having a voltage on a bus line;

providing a second transceiver configured to communicate the signal on the bus line having a characteristic impedance, the second transceiver output impedance including a pull-up circuit and a pull-down circuit;

setting an output impedance of the second transceiver as a function of the bus line characteristic impedance;

communicating the signal onto the bus line;

while communicating the signal;

generating an error signal as a function of comparing the signal voltage to a reference voltage;

sensing the signal voltage on the bus line, wherein the signal voltage is a function of the output impedance of the second transceiver; and adjusting one of the pull-up circuit and the pull-down circuit so that the output impedance of the second transceiver is changed to control the signal voltage and reduce an amplitude of the error signal.

14. The method of claim 13 further comprising:

setting a termination impedance of the second transceiver configured to receive the signal on the bus line;

setting the output impedance of the first transceiver configured to communicate the signal on the bus line; and adjusting the output impedance of the first transceiver.

15. The method of claim 13 wherein adjusting the output impedance of the second transceiver comprises moving the output impedance to bring the voltage on the bus line closer to the reference voltage.

16. The method of claim 13 further comprising:

comparing the sensed voltage to the reference voltage; and adjusting a termination impedance of the first transceiver based upon the comparison.

* * * * *